(12) United States Patent
Jäntti et al.

(10) Patent No.: US 10,733,117 B2
(45) Date of Patent: Aug. 4, 2020

(54) PROGRAMMABLE RADIO TRANSCEIVERS

(71) Applicant: Nordic Semiconductor ASA, Trondheim (NO)

(72) Inventors: Joni Jäntti, Oulu (FI); Kimmo Puusaari, Oulu (FI); Hannu Talvitie, Oulu (FI); Olli Närhi, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 111 days.

(21) Appl. No.: 16/065,568

(22) PCT Filed: Oct. 31, 2016

(86) PCT No.: PCT/GB2016/053379
§ 371 (c)(1),
(2) Date: Jun. 22, 2018

(87) PCT Pub. No.: WO2017/109450
PCT Pub. Date: Jun. 29, 2017

(65) Prior Publication Data
US 2019/0095362 A1    Mar. 28, 2019

(30) Foreign Application Priority Data

Dec. 23, 2015 (GB) .................................. 1522767.1

(51) Int. Cl.
*G06F 11/00* (2006.01)
*G06F 13/16* (2006.01)
(Continued)

(52) U.S. Cl.
CPC ... *G06F 13/1668* (2013.01); *G01R 31/31705* (2013.01); *G06F 3/061* (2013.01);
(Continued)

(58) Field of Classification Search
CPC ............ G06F 11/3466; G06F 11/3471; G06F 11/3476; G06F 11/3485; G06F 11/349;
(Continued)

(56) References Cited

U.S. PATENT DOCUMENTS

2006/0211387 A1    9/2006  Pisek et al.
2010/0332909 A1*   12/2010 Larson ................ G06F 11/3476
                                                            714/40
(Continued)

FOREIGN PATENT DOCUMENTS

EP    2 728 491 A1    5/2014
GB    2 397 737 A     7/2004
(Continued)

OTHER PUBLICATIONS

International Search and Written Report for PCT/GB2016/053379, dated Jan. 20, 2017, 12 pages.
(Continued)

*Primary Examiner* — Sarai E Butler
(74) *Attorney, Agent, or Firm* — Klarquist Sparkman, LLP

(57) ABSTRACT

A radio frequency transceiver device comprises a control register unit including one or more registers and a central processing unit arranged to access the one or more registers via a memory bus. The device also comprises a sequencer module comprising one or more configuration registers connected to the central processing unit via a control bus and also comprises one or more trigger inputs. A sequencer memory module is connected to the sequencer module and is arranged to store one or more read/write commands comprising instructions to read from and/or write to the registers within the control register unit. The sequencer module is arranged such that upon receiving a trigger event
(Continued)

via at least one of the one or more trigger inputs, it executes the one or more read/write commands.

25 Claims, 4 Drawing Sheets

(51) Int. Cl.
| | | |
|---|---|---|
| G06F 9/38 | (2018.01) | |
| H04B 1/00 | (2006.01) | |
| G06F 9/30 | (2018.01) | |
| G01R 31/317 | (2006.01) | |
| G06F 3/06 | (2006.01) | |
| H04B 1/38 | (2015.01) | |

(52) U.S. Cl.
CPC .......... *G06F 3/0659* (2013.01); *G06F 3/0673* (2013.01); *G06F 9/30101* (2013.01); *G06F 9/3881* (2013.01); *H04B 1/0003* (2013.01); *H04B 1/38* (2013.01)

(58) Field of Classification Search
CPC ............. G06F 11/3495; G06F 11/3636; G06F 11/364; G06F 11/348
USPC .......................................................... 714/45
See application file for complete search history.

(56) References Cited

U.S. PATENT DOCUMENTS

| | | | |
|---|---|---|---|
| 2011/0153207 A1* | 6/2011 | Suzaki | G01C 21/26 701/532 |
| 2011/0271126 A1* | 11/2011 | Hill | G06F 1/3203 713/320 |
| 2013/0111276 A1* | 5/2013 | Terayama | G06F 11/2236 714/49 |
| 2013/0166794 A1 | 6/2013 | Hatula et al. | |
| 2014/0245076 A1* | 8/2014 | Bansal | G06F 11/3648 714/47.1 |
| 2015/0050926 A1* | 2/2015 | Warneke | G06F 1/3234 455/418 |

FOREIGN PATENT DOCUMENTS

| | | |
|---|---|---|
| JP | 2011-133324 A | 7/2011 |
| WO | WO 2007/089437 A2 | 1/2007 |

OTHER PUBLICATIONS

Search Report under Section 17(5) for GB1522767.1, dated Jun. 17, 2016, 3 pages.

* cited by examiner

PROGRAMMABLE RADIO TRANSCEIVERS

CROSS REFERENCE TO RELATED APPLICATIONS

This is the U.S. National Stage of International Application No. PCT/GB2016/053379, filed Oct. 31, 2016, which was published in English under PCT Article 21(2), which in turn claims the benefit of Great Britain Application No. 1522767.1, filed Dec. 23, 2015.

The present invention relates to radio frequency transceivers, particularly transceivers that arranged to perform time-critical operations during runtime.

Radio frequency communications systems such as those used for cellular radio communications typically have strict timing requirements. These timing requirements arise both from hardware requirements imposed by the transceivers used and the standards that are associated with a given communications system protocol such as the LTE® standard outlined by the 3rd Generation Partnership Project (3GPP).

Such communications systems typically include one or more radio frequency transceiver devices having a baseband modem that modulates and demodulates data, using e.g. quadrature modulation, that is transmitted and received over the air using a radio frequency carrier wave. Typically, the baseband signal processing is carried out by digital signal processing (DSP) software and hardware accelerators that carry out the processing in "burst mode" (i.e. batches of data are processed intermittently rather than continuously) so as to save power. In order to ensure that the actual over-the-air (OTA) communications occur at the correct times regardless of the burst mode processing, a synchronisation process is typically carried out to ensure that each individual system (e.g. a handheld device with a radio transceiver) is synchronised to the network time.

However, the Applicant has appreciated that conventional software sequencers running on a dedicated control central processing unit (CPU) require relatively high clock frequencies and/or a relatively large processor core. Additionally, software sequencers cannot necessarily guarantee accurate timing of the synchronisation processing steps, especially when the sequencer is running on the control processor or a baseband processing unit which may be executing other tasks at the same time as the synchronisation process is taking place.

Another approach that is known in the art per se is to use a programmable state machine. A state machine allows for a sequence of processing steps to be carried out under given conditions. However, the Applicant has appreciated that state machine controls must be predefined during the design phase, preventing the state machine from accessing any register other than those for which it was pre-programmed. This clearly hinders flexibility. System flexibility is valuable for: creating an optimal configuration for a given application; creating further configurations for applications that were not foreseen at the time the device was designed; providing OTA updates to customers; and supporting multiple radio protocols with a single device.

When viewed from a first aspect the present invention provides a radio frequency transceiver device comprising:
  a control register unit comprising one or more registers;
  a central processing unit arranged to access the one or more registers via a memory bus;
  a sequencer module comprising: one or more configuration registers connected to the central processing unit via a control bus; and one or more trigger inputs;
  a sequencer memory module connected to the sequencer module, the sequencer memory module being arranged to store one or more read/write commands comprising instructions to read from and/or write to the registers within the control register unit;
  wherein the sequencer module is arranged such that upon receiving a trigger event via at least one of the one or more trigger inputs, it executes the one or more read/write commands.

The present invention extends to a method of operating a radio frequency transceiver device comprising:
  a control register unit comprising one or more registers;
  a central processing unit arranged to access the one or more registers via a memory bus;
  a sequencer module comprising one or more configuration registers connected to the central processing unit via a control bus; and one or more trigger inputs; and
  a sequencer memory module connected to the sequencer module, the sequencer memory module being arranged to store one or more read/write commands comprising instructions to read from and/or write to the registers within the control register unit;
  wherein the method comprises:
  executing the one or more read/write commands upon receiving a trigger event via at least one of the one or more trigger inputs.

Thus it will be appreciated by those skilled in the art that at least in embodiments thereof, the present invention provides an improved radio frequency transceiver device and method that can provide time-accurate access to the registers within the control register unit independently of the CPU. This helps to address the problems outlined above with regard to relying on the CPU. It also allows more flexibility than the state machine approach as will be explained further later.

While single read and write operations may be carried out by the sequencer module upon receiving the trigger, the Applicant has appreciated that the present invention is particularly advantageous in embodiments wherein a plurality of commands are required to be executed sequentially. This therefore provides direct sequence access (DSA), which can be considered to be a dedicated "control accelerator" that can run a number of read and write operations that may have been expensive (e.g. in terms of processing power or current consumption) or potentially impossible to achieve using the CPU.

Each trigger event may be associated with a particular sequence of read/write commands that are to be executed should a certain condition be met. These sequences may be associated with a particular trigger by configuring the sequencer such that a given trigger event causes the sequencer to access a particular address in the control register unit. This may, for example, be a sequence start address, which acts as an "index" to the memory location at which the list of read/write commands begins.

In some embodiments, the one or more trigger inputs include one or more software trigger registers. These software trigger registers may be arranged such that once a specific value is written thereto (e.g. by writing a logic high or "1" to a specific bit in the register), the sequencer module will begin executing the instructions stored in the sequencer memory module. The trigger event may comprise a rising edge, a falling edge or a specific logic level being present on the trigger input. In some such embodiments, the trigger event can comprise a start trigger written to at least one of the one or more software trigger registers by the central processing unit. The software trigger registers, to which the CPU writes a start trigger, may be implemented within the sequencer module's configuration registers.

Additionally or alternatively, in some embodiments the one or more trigger inputs include one or more hardware trigger inputs. Having a dedicated hardware trigger input allows for peripheral devices to trigger the execution of the sequence of read/write commands without requiring the CPU. In some such embodiments, the trigger event can comprise a predetermined signal sent to at least one of the one or more hardware trigger inputs. In a set of such embodiments, the central processing unit is arranged to program a timer that provides the predetermined signal at a predetermined time. In some embodiments, the predetermined signal is periodic. This therefore advantageously guarantees the sequence timing regardless of the CPU's load at any given time.

In some embodiments, the sequencer module further comprises one or more trigger configuration inputs. These trigger configuration inputs may be used to tune the sequence characteristics without requiring reconfiguration of the sequencer itself. For example, an offset can be added to the memory address at which the one or more read/write commands to be executed upon triggering is stored, such that different commands can be carried out instead for the same trigger event. The Applicant has recognised that this is particularly advantageous when the trigger event originates from source that is unable to configure the sequencer itself e.g. an external hardware module.

While the sequencer module may continuously operate the instructions in a loop once triggered or simply run through the instructions exhaustively, in some embodiments the microcontroller stops executing the one or more predetermined commands when a stop condition is met. It may be desirable to execute the instructions only for a set length of time and thus in some embodiments the stop condition occurs at a predetermined time. The stop condition may be provided by a last read/write command stored in the sequencer's memory. In alternative embodiments, the stop condition requires a stop event to be input to at least one of the one or more trigger inputs.

While the sequencer may carry out read/write operations as described above, in some embodiments the sequencer is further arranged to write debug messages to a debugger. In some such embodiments, the debug messages are written to the debugger via a trace bus. This allows for some debugging operations to be automated by the sequencer if required.

Certain embodiments of the invention will now be described, by way of example only, with reference to the accompanying drawings in which.

Figure 1:
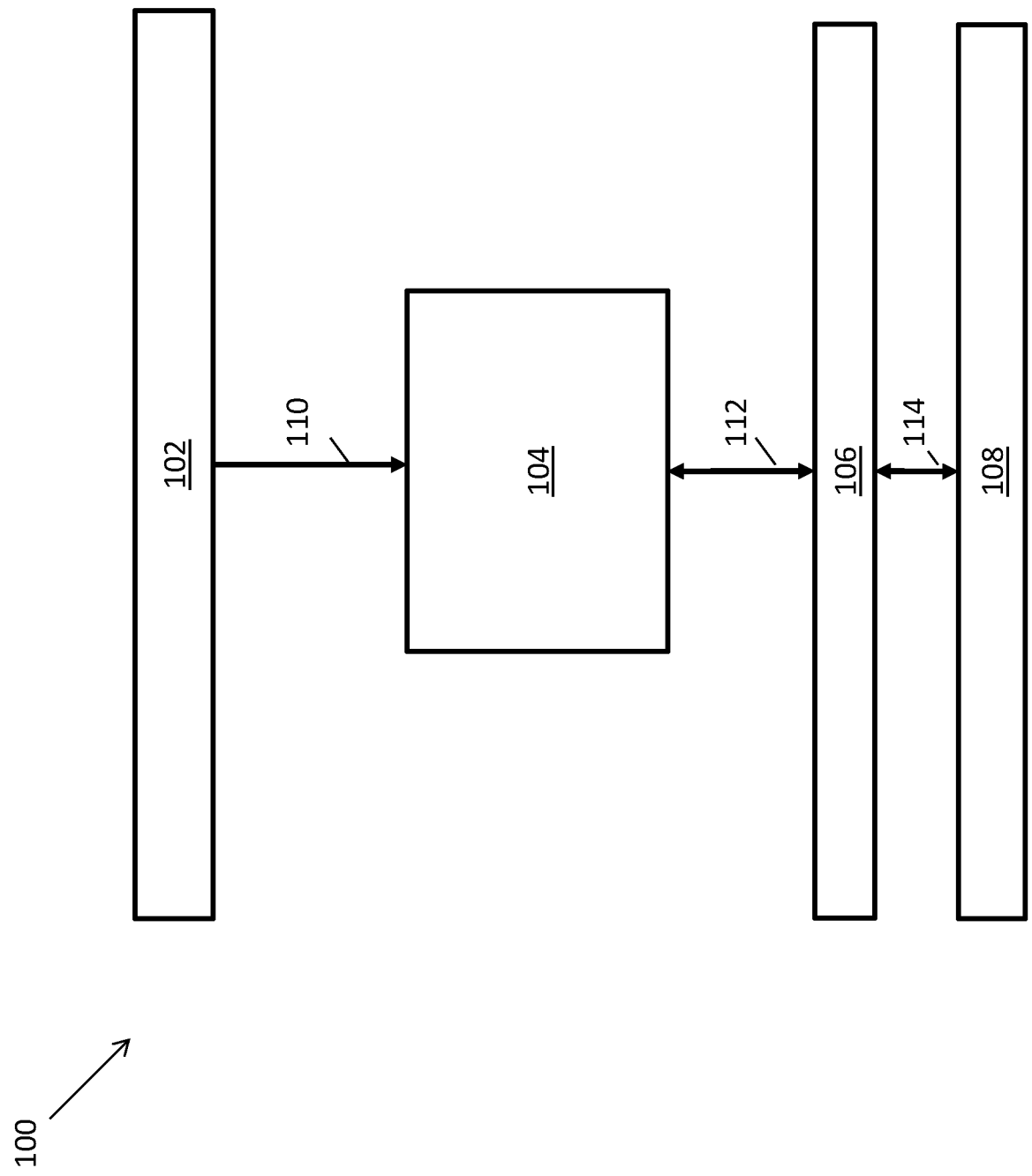
FIG. 1 shows a typical high level cellular radio architecture.

FIG. 1 shows a typical high level cellular radio architecture 100. The cellular radio architecture 100 comprises: a baseband modem 102; a radio frequency control unit 104; radio frequency digital circuitry 106; and radio frequency analogue circuitry 108. The baseband modem 102 is arranged such that it can modulate and demodulate signals transmitted and received over the network (i.e. over the air) using modulation techniques (e.g. quadrature modulation techniques) that are known in art per se.

Typically the baseband signal processing is done in burst mode to save power. Burst mode requires synchronisation between the system and the network to function correctly. In order to achieve synchronisation, the baseband modem 102 is arranged to send high level commands as well as either: timing strobes that are used to directly trigger the transmissions and/or receptions; or a timestamp referred to network time. In either case, the radio frequency control unit 104 is arranged to provide low latency, clock-cycle-accurate controls to the radio frequency digital circuitry 106 and the radio frequency analogue circuitry 108 via a bus 112. The radio frequency digital circuitry 106 has a connection 114 to the radio frequency analogue circuitry 108 via analogue-to-digital and digital-to-analogue converters (not shown).

Figure 2:
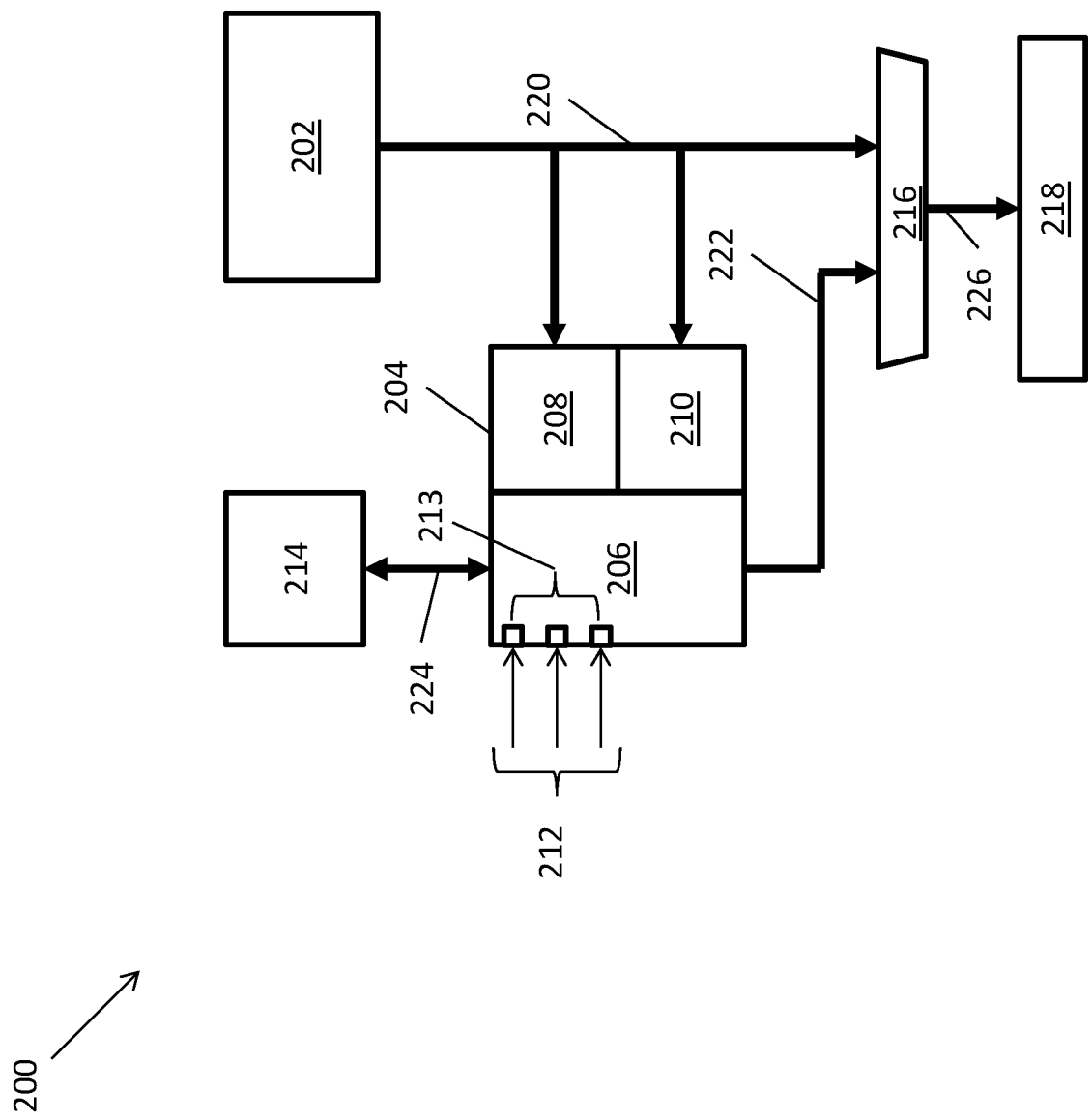
FIG. 2 shows a block diagram of a radio frequency transceiver device in accordance with an embodiment of the present invention.

FIG. 2 shows a block diagram of a radio frequency transceiver device 200 in accordance with an embodiment of the present invention. The radio frequency transceiver device 200 comprises: a central processing unit (CPU) 202; a sequencer module 204; a sequencer module memory unit 214; a control register unit 218; and a multiplexer 216. In this particular example the control register unit 218 and the sequencer memory unit 214 both comprise random access memory (RAM). The control register unit 218 is arranged to store a number of peripheral control registers. The sequencer module memory unit 214 is arranged to store a list of instructions for read and write operations that should be carried out on the registers stored in the control register unit 218.

The sequencer module 204 comprises: a sequencer core 206; a number of configuration registers 210; a number of software triggers 208; and a number of hardware triggers 212 which are connected to the sequencer core 206 via a set of pins 213. Additionally or alternatively, the hardware triggers 212 may be connected to some other hardware within the transceiver 200 that is not shown on this Figure. The sequencer module 204 may also have inputs for trigger configuration signals which allow the configuration of the trigger inputs to be altered as will be explained below.

The sequencer module 204 is also connected to the sequencer module memory unit 214 via a memory bus 224. The central processing unit 202 is arranged to communicate with the sequencer module 204 using another bus 220. The control register unit 218 is connected to the multiplexer 216 via a further memory bus 226. There is also a direct connection between the sequencer module 204 and the multiplexer 216 via a sequencer-multiplexer bus 222.

The central processing unit 202 can configure the sequencer module 204 by writing configuration data to the configuration registers 210. The sequencer core 206 then read the list of read and write instructions from the sequencer module memory unit 214 via the memory bus 224 and executes the sequence of read and write accesses via the sequencer-multiplexer bus 222 accordingly.

The sequencer module 204 is arranged such that each trigger event is "mapped" to a particular memory location at which the sequence of read/write commands is stored. This may, by way of example only, be implemented using a look-up table (LUT). This LUT could have an entry for each possible trigger input and/or trigger event, wherein the entry in the LUT includes a sequence start address. This sequence start address is then used to point the sequencer core 206 at that address in the sequencer module memory unit 214.

The sequencer module 204—or more specifically the sequence of read/write commands that it carries out for a given trigger event—may then be configured by adding an offset to the memory address at which the sequence of read/write commands is stored, such that different commands can be carried out instead for the same trigger event.

In use the sequencer module 204 carries out the sequence of read and write instructions that are stored on the sequencer module memory unit 214 upon receiving a trigger either via the software triggers 208 or the hardware triggers 212 as described in further detail below.

The multiplexer 216 selects whether the CPU 202 or the sequencer module 204 has access to the registers stored in the control register unit 218 at any given time. During normal operation the CPU 202 will read and write data to and from the registers stored in the control register unit 218. However, when triggered, the multiplexer 216 switches access to the registers from the CPU 202 to the sequencer module 204 (i.e. the sequencer module 204 takes precedence over the CPU 202). Subsequently, the sequencer module 204 executes the list of read and write instructions stored in the sequencer module memory unit 214 so as to read and write data as appropriate to the registers stored in the control register unit 218.

The sequencer module 204 can be triggered in software via the software triggers 208 and/or in hardware via the hardware triggers 212 as described above. The central processing unit 202 can directly cause triggering of the sequencer module 204 either by directly writing a start trigger to a register within the software triggers 208 using the bus 220 or it can pre-program a timer (not shown) that sends a signal at a predetermined time (e.g. at a specific time or after a chosen amount of time has elapsed) to the hardware trigger inputs 212. It is also possible to arrange the sequencer module 204 such that, upon reaching the end of its sequence, the sequencer module 204 reprograms the trigger configuration without intervention from the CPU 202 so that other functionality is carried out for the same trigger input. In order to achieve this, the sequencer-multiplexer bus 222 may also be connected to the configuration registers 210 (though this particular arrangement is not shown in this Figure).

The connection 222, 226 between the sequencer module 204 and the control register unit 218 allows the sequencer module 204 to execute the list of instructions stored in the sequencer module memory unit 214 independently of the load present on the CPU 202. This therefore allows a list of control instructions that are known a priori without needing to use the CPU 202.

Figure 3:
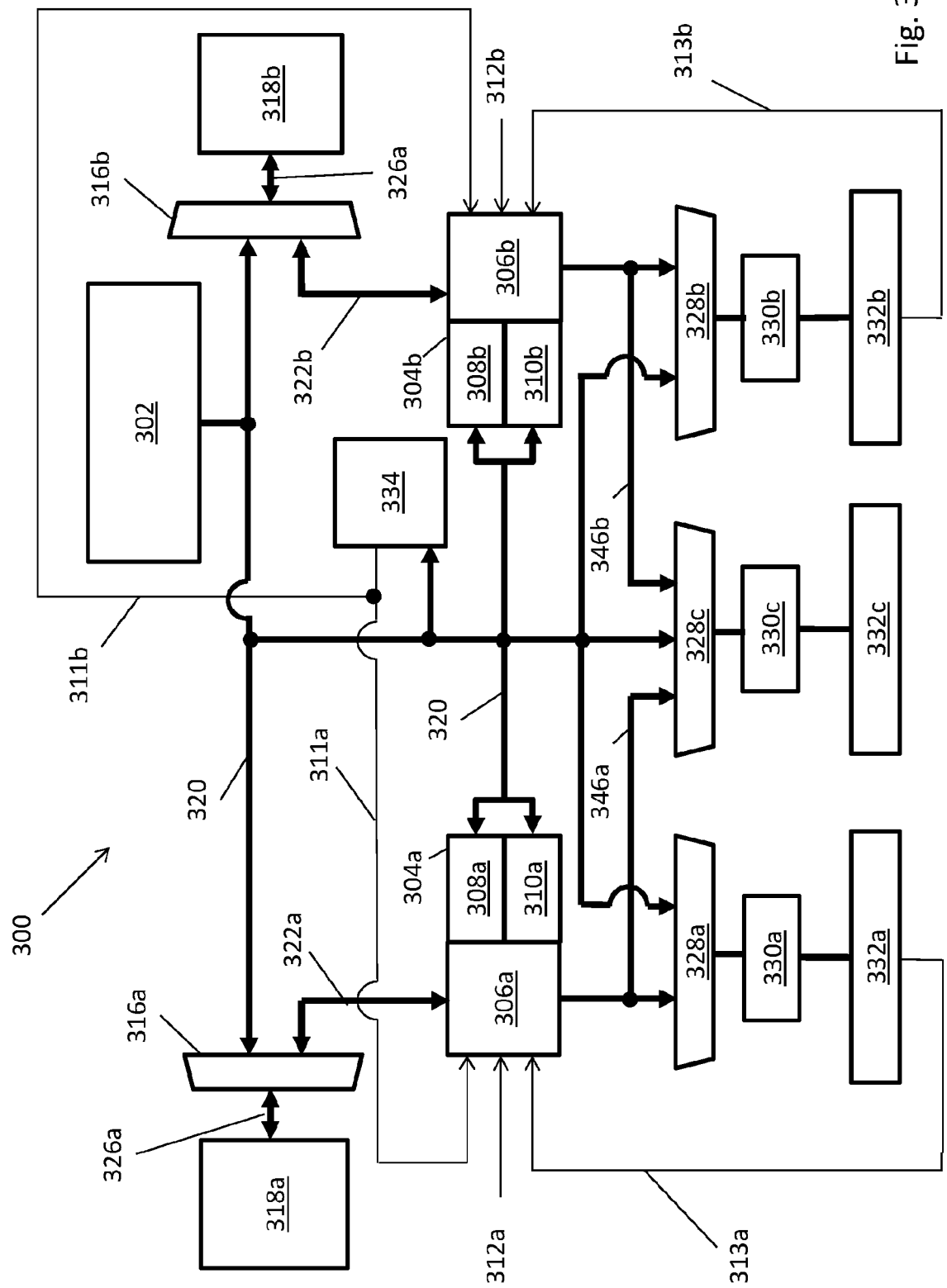
FIG. 3 shows a block diagram of an LTE® system that implements the radio frequency transceiver architecture of FIG. 2.

FIG. 3 shows a block diagram of an LTE® system 300 that implements the radio frequency transceiver architecture of FIG. 2. The transceiver 300 of FIG. 3 implements a number of registers 332a-c (implemented within respective memory modules) for reception, transmission, and common functionality respectively. The transceiver 300 comprises: a CPU 302; two sequencer modules 304a, 304b; two memory modules 318a, 318b for reception and transmission respectively; a number of multiplexers 316a, 316b, 328a, 328b, 328c; and a system timer 334.

Each of the sequencer modules 304a, 304b comprises: a microcontroller 306a, 306b; software triggers 308a, 308b; and configuration registers 310a, 310b. Each of the sequencer modules 304a, 304b is also provided with hardware trigger inputs 311a, 311b, 312a, 312b, 313a, 313b. One of the hardware trigger inputs 311a, 311b provided on each sequencer module 304a, 304b is connected to the hardware timer 334.

As described previously, each of the frequency modules 304a, 304b is arranged to carry out a sequence of instructions stored in their respective sequence module memory units 318a, 318b. The instructions stored in the reception sequence module memory unit 318a comprise read and write operations to be carried out on the registers stored in the reception and common registers 332a, 332c. Similarly the instructions stored in the transmission sequence module memory unit 318b relate to read and write operations that are to be carried out on the registers within the transmission and common registers 332b, 332c.

As previously described with reference to FIG. 2, the reception and transmission sequencer modules 304a, 304b can be triggered by the software using software triggers 308a, 308b or by the hardware triggers 311a, 312a, 313a, 311b, 312b 313b. The CPU 302 can write a start trigger to a register within the software registers 308a, 308b if triggering of the reception and/or transmission sequencer modules 304a, 304b is required.

Each of the reception 332a, transmission 332b, and common 332c registers is connected to a multiplexer 328a, 328b, 328c via a respective bus 330a, 330b, 330c. The reception sequencer module 304a is connected to the reception multiplexer 328a and the common multiplexer 328c via a reception sequencer bus 346a. Similarly, the transmission sequencer module 304b is connected to the transmission and common multiplexers 328b, 328c via a transmission sequencer bus 346b. The CPU 302 is connected to the sequencer modules 304a, 304b (via their respective software triggers 308a, 308b and configuration registers 310a, 310b), the multiplexers 316a, 316b, 328a, 328b, 328c, and the timer 334 via a further bus 320.

As described previously with reference to FIG. 2, the CPU 302 can read and write data to the registers within the reception, common and transmission registers 332a, 332b, 332c during regular operation. However, when triggered, the sequencer modules 304a, 304b read and write data to and from the reception and transmission memory modules 318a, 318b by switching the respective multiplexers 316a, 316b to provide a direct connection between either one or both of the sequencer module 304a, 304b and the respective reception and transmission memory modules 332a, 332b as appropriate. Once triggered, the sequencer modules 304a, 304b execute the list of instructions stored in their sequencer memory module 318a, 318b respectively.

The timer 334 may be arranged to issue triggers via the hardware trigger inputs 311a, 311b at predetermined times e.g. periodically, or the CPU 302 may be arranged to set the timer 334 such that it produces a trigger on the hardware trigger inputs 311a, 311b at a selected time or after a predetermined duration has elapsed.

A second set of hardware trigger inputs 312a, 312b allow the baseband modem to directly issue a trigger to the reception and/or transmission sequencer modules 304a, 304b if it requires the instructions stored in the reception and/or transmission sequencer module memory units 318a, 318b to be executed.

Furthermore, the sequencer modules 304a, 304b may be interrupted by the reception, transmission, or common hardware 332a, 332b, 332c. This provides a hardware feedback path from the radio hardware to the sequencer modules 304a, 304b such that the hardware 332a, 332b, 332c can instruct the sequencer modules 304a, 304b to execute the instructions stored in the respective sequencer module memory units 318a, 318b directly while the CPU 302 can remain in a low power mode of operation. It will be appreciated that while the "hardware" in this particular transceiver 300 are implemented by registers, one or more of them may be realised as discrete hardware modules.

The multiplexers 328a, 328b, 328c provide the transceiver 300 with the ability to switch between the CPU 302 or the sequencer modules 304a, 304b having access to the reception 332a, transmission 332b, and common 332c registers. The reception and transmission sequencer buses 346a, 346b provide the sequencer modules 304a, 304b with a connection to the reception 332a, transmission 332b and common 332c registers if required.

Figure 4:
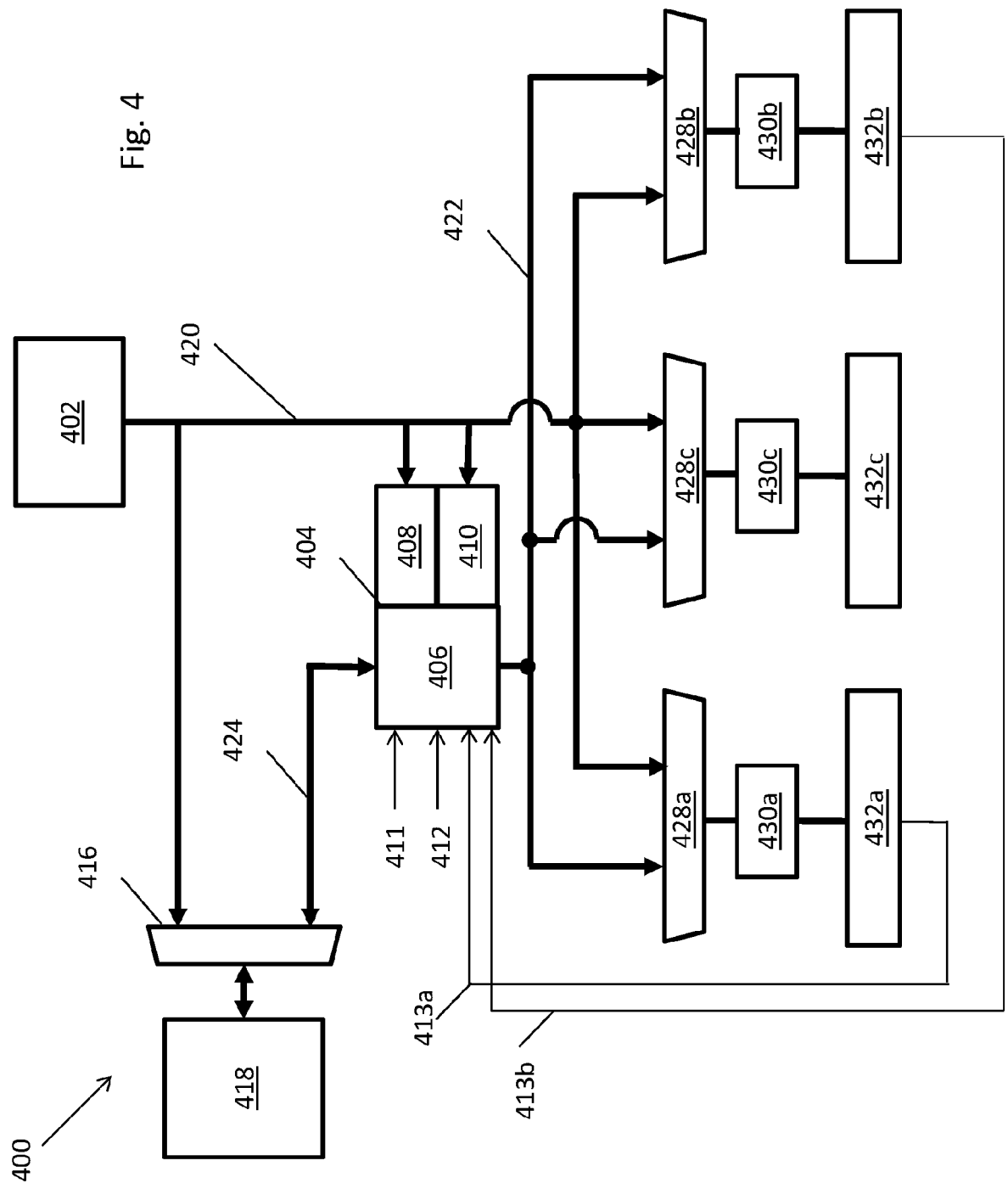
FIG. 4 shows a block diagram of a further radio communication system that implements the radio frequency transceiver architecture of FIG. 2.

FIG. 4 shows a block diagram of a further radio communication system 400 that implements the radio frequency transceiver architecture of FIG. 2. The system 400 comprises: a CPU 402; a sequencer module 404; a sequencer module memory unit 418; a number of multiplexers 416, 428a, 428b, 428c; and reception 432a, transmission 432b, and common 432c registers. In this embodiment only a single sequencer module 404 is arranged to execute instructions stored in the sequencer module memory unit 418.

A multiplexer 416 is used to pass to the sequencer module memory unit 418 the input from either the CPU via a CPU control bus 420 or by the sequencer module 404 via a sequencer memory bus 424 depending on which one has higher priority. Similarly reception 428a, transmission 428b and common 428c multiplexers are selectably arranged to provide access to the reception 432a, transmission 432b and common 432c registers to either the CPU or the sequencer module 404 as required. Each of these multiplexers 428a, 428b, 428c is connected to its respective register 432a, 432b, 432c via an APB 430a, 430b, 430c respectively.

Similarly to the LTE® transceiver 300 shown in FIG. 3, the sequencer module 404 takes hardware triggers from a number of different sources. The sequencer module 404 has a timer hardware trigger input 411 to which a hardware timer (not shown) may be connected such that the sequencer module 404 is triggered at some specified time as described previously. A second hardware trigger input 412 is connected such that the baseband modem can issue trigger commands directly to the sequencer module 404. Finally a pair of hardware trigger inputs 413a, 413b are connected such that the reception 432a and transmission 432b registers respectively have a feedback path to the sequencer module 404.

As before a CPU can configure the sequencer module 404 by writing configuration data to the configuration registers 410. The CPU may also cause software based triggers by writing to the software trigger registers 408 if required.

When triggered either using the software trigger 408 or hardware trigger inputs 411, 412, 413a, 413b, the sequencer module 404 executes the instructions stored on the sequencer module memory unit 418. These instructions may comprise executing read and/or write operations on the reception 432a, transmission 432b or common 432c registers or registers within a control register unit (not shown) in the same way as described hereinbefore.

It will be appreciated by those skilled in the art that the embodiments described provide an improved radio frequency transceiver device that can execute sequences of read and write operations independently of the central processing unit so as to ensure sequence timing regardless of CPU load. As the sequence processing is carried out by an independent sequencer module, lower clock frequencies and/or smaller processing cores may be selected when compared with conventional radio frequency transceivers. Furthermore by integrating multiple sequencer modules into one radio frequency system, it is possible to enable control of multiple activities simultaneously which is advantageous for certain communication protocols such as time-division LTE® (TD-LTE®). Although particular embodiments have been described in detail, it will be appreciated by those skilled in the art that many variations and modifications are possible using the principles of the invention set out herein.

The invention claimed is:

1. A radio frequency transceiver device comprising: a control register unit comprising one or more registers; a central processing unit arranged to access the one or more registers within the control register unit via a memory bus; a sequencer module comprising: one or more configuration registers connected to the central processing unit via a control bus; one or more trigger inputs; and one or more trigger configuration inputs; and a sequencer memory module connected to the sequencer module, the sequencer memory module being arranged to store one or more read/write commands comprising instructions to read from and/or write to the registers within the control register unit; wherein the sequencer module is arranged such that upon receiving a trigger event via at least one of the one or more trigger inputs, it executes one or more sequences of read/write commands; and the one or more trigger configuration inputs are arranged to allow sequence characteristics to be tuned without requiring reconfiguration of the sequencer module itself.

2. The device of claim 1, wherein the one or more trigger inputs include one or more software trigger registers.

3. The device of claim 2, wherein the trigger event comprises a start trigger written to at least one of the one or more software trigger registers by the central processing unit.

4. The device of claim 1, wherein the one or more trigger inputs include one or more hardware trigger inputs.

5. The device of claim 4, wherein the trigger event comprises a predetermined signal sent to at least one of the one or more hardware trigger inputs.

6. The device of claim 5, wherein the central processing unit is arranged to program a timer that provides the predetermined signal at a predetermined time.

7. The device of claim 6, wherein the predetermined signal is periodic.

8. The device of claim 1, wherein the central processing unit is arranged to stop executing the one or more predetermined commands when a stop condition is met.

9. The device of claim 8, arranged such that the stop condition occurs at a predetermined time.

10. The device of claim 9, wherein the stop condition comprises a last read/write command stored in the sequencer's memory.

11. The device of claim 8, wherein the stop condition requires a stop event to be input to at least one of the one or more trigger inputs.

12. The device of claim 1, wherein the sequencer is further arranged to write debug messages to a debugger.

13. The device of claim 12, wherein the debug messages are written to the debugger via a trace bus.

14. A method of operating a radio frequency transceiver device comprising: a control register unit comprising one or more registers; a central processing unit arranged to access the one or more registers of the control register unit via a memory bus; a sequencer module comprising one or more configuration registers connected to the central processing unit via a control bus; one or more trigger inputs; and one or more trigger configuration inputs; and a sequencer memory module connected to the sequencer module, the sequencer memory module being arranged to store one or more read/write commands comprising instructions to read from and/or write to the registers within the control register unit; wherein the method comprises: using the trigger configuration inputs to tune characteristics of one or more sequences of read/write commands without reconfiguring the sequencer module itself; and executing one or more of said sequences of read/write commands upon receiving a trigger event via at least one of the one or more trigger inputs.

15. The method of claim 14, further comprising generating the trigger event by writing a start trigger to at least one of the one or more software trigger registers.

16. The method of claim 14, wherein the one or more trigger inputs include one or more hardware trigger inputs.

17. The method of claim 16, further comprising generating the trigger event by sending a predetermined signal to at least one of the one or more hardware trigger inputs.

18. The method of claim 17, further comprising programming a timer to provide the predetermined signal at a predetermined time.

19. The method of claim 18, wherein the predetermined signal is periodic.

20. The method of claim 14, further comprising stopping executing the one or more predetermined commands when a stop condition is met.

21. The method of claim 20, wherein the stop condition occurs at a predetermined time.

22. The method of claim 21, wherein the stop condition comprises a last read/write command stored in the sequencer's memory.

23. The method of claim 20, wherein the stop condition requires a stop event to be input to at least one of the one or more trigger inputs.

24. The method of claim 14, comprising the sequencer writing debug messages to a debugger.

25. The method of claim 24, wherein the debug messages are written to the debugger via a trace bus.

* * * * *